(12) United States Patent
Chen

(10) Patent No.: US 7,847,617 B2
(45) Date of Patent: Dec. 7, 2010

(54) CHARGE PUMP AND METHOD FOR OPERATING THE SAME

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 82 days.

(21) Appl. No.: 11/954,124

(22) Filed: Dec. 11, 2007

(65) Prior Publication Data

US 2009/0146702 A1 Jun. 11, 2009

(51) Int. Cl.
*G05F 1/10* (2006.01)
(52) U.S. Cl. .................. 327/536; 363/60
(58) Field of Classification Search .......... 327/536; 363/59–60
See application file for complete search history.

(56) References Cited

U.S. PATENT DOCUMENTS

| | | | | |
|---|---|---|---|---|
| 4,970,409 A | * | 11/1990 | Wada et al. ................ 327/541 |
| 5,227,675 A | * | 7/1993 | Taguchi ..................... 327/530 |
| 5,280,420 A | * | 1/1994 | Rapp ............................ 363/60 |
| 5,818,766 A | * | 10/1998 | Song ...................... 365/189.11 |
| 5,982,222 A | | 11/1999 | Kyung et al. |
| 6,009,022 A | * | 12/1999 | Lee et al. ............... 365/189.09 |
| 6,469,569 B1 | * | 10/2002 | Miyamitsu ................ 327/536 |
| 6,490,220 B1 | | 12/2002 | Merritt et al. |
| 6,535,435 B2 | * | 3/2003 | Tanaka et al. .......... 365/189.09 |
| 6,617,933 B2 | * | 9/2003 | Ito et al. ....................... 331/25 |
| 6,650,172 B1 | * | 11/2003 | Shingyouchi ............... 327/536 |
| 6,756,837 B2 | * | 6/2004 | Kawai et al. ................ 327/536 |
| 6,781,440 B2 | * | 8/2004 | Huang ........................ 327/537 |
| 6,882,215 B1 | * | 4/2005 | Lee ............................. 327/536 |
| 7,443,230 B2 | * | 10/2008 | Chen et al. .................. 327/535 |
| 2005/0013176 A1 | | 1/2005 | Lim et al. |
| 2007/0070695 A1 | | 3/2007 | Lim et al. |

* cited by examiner

*Primary Examiner*—Lincoln Donovan
*Assistant Examiner*—Thomas J Hiltunen
(74) *Attorney, Agent, or Firm*—Connolly Bove Lodge & Hutz LLP

(57) ABSTRACT

A charge pump comprises a ring oscillator and a pumping circuit. The ring oscillator provides a plurality of oscillating clocks. The pumping circuit includes a plurality of pumping blocks coupled to each other for outputting a boosted voltage, and each pumping block is connected to a corresponding oscillating clock.

9 Claims, 7 Drawing Sheets

CHARGE PUMP AND METHOD FOR OPERATING THE SAME

BACKGROUND OF THE INVENTION

1. Field of the Invention

The present invention relates to a charge pump and the method for operating the same, and more particularly, to a charge pump which has limited voltage variation.

2. Description of the Related Art

It is a clear trend that semiconductor memory devices are becoming more highly integrated and low operating supply voltages are being widely used. However, even memory devices that operate at a low voltage still need high voltage power supply for certain internal circuits and operations such as driving bit lines and word lines. For such a purpose, a variety of charge pumps for generating high voltage have been developed.

FIG. 1 shows a traditional charge pump 10, which is driven by a constant frequency clock OSC. However, there is an excess of charge pump output and power consumption in a high-voltage state.

U.S. Pat. No. 6,490,220 discloses a multiple core charge pump including a plurality of switches disposed between the taps of a delay chain and the individual charge pump cores. The charge pump is divided into five charge pump cores to avoid a loud noise due to simultaneous conduction. For this purpose, delay chains are used to separate the turn-on time of each charge pump core. However, the delay chains are highly dependent on the ambient temperature and operating voltage. If there is any unusual variation in the ambient temperature and operating voltage, the charge pump will fail to achieve its original purpose. Or the delay chains can be made insensitive to temperature, process and voltage. But this may need a complex design.

SUMMARY OF THE INVENTION

The above-mentioned problems are addressed by the present invention. The structure and method of the present invention will be understood according to the disclosure of the following specification and drawings.

According to one embodiment of the present invention, the charge pump comprises a ring oscillator and a pumping circuit. The ring oscillator includes odd number of inverters connected in series, wherein the outputs of the inverters provide a plurality of oscillating clocks. The pumping circuit includes a plurality of pumping blocks coupled to each other for outputting a boosted voltage, and each pumping block is connected to a corresponding oscillating clock.

According to one embodiment of the present invention, the charge pump comprises a pumping circuit, an oscillator and a feedback circuit. The pumping circuit is used to output a boosted voltage. The oscillator includes odd number of inverters connected in series, wherein the outputs of the inverters provide a plurality of oscillating clocks. The feedback circuit is used to generate the power voltage of the oscillator in response to the boosted voltage. The power voltage of the ring oscillator is adversely proportional to the boosted voltage.

According to one embodiment of the present invention, the method for operating a charge pump comprises the steps of: generating a series of oscillating clocks from a ring oscillator, wherein the ring oscillator includes odd number of inverters connected in series, and the oscillating clocks are extracted from the output of the inverters; transmitting the oscillating clocks to a plurality of pumping blocks, where any interval between one oscillating clock and its preceding oscillating clock is the same as that between the others; and combining the output of pumping blocks to form a boosted voltage.

BRIEF DESCRIPTION OF THE DRAWINGS

The invention will be described according to the appended drawings in which.

DETAILED DESCRIPTION OF THE INVENTION

Figure 2:
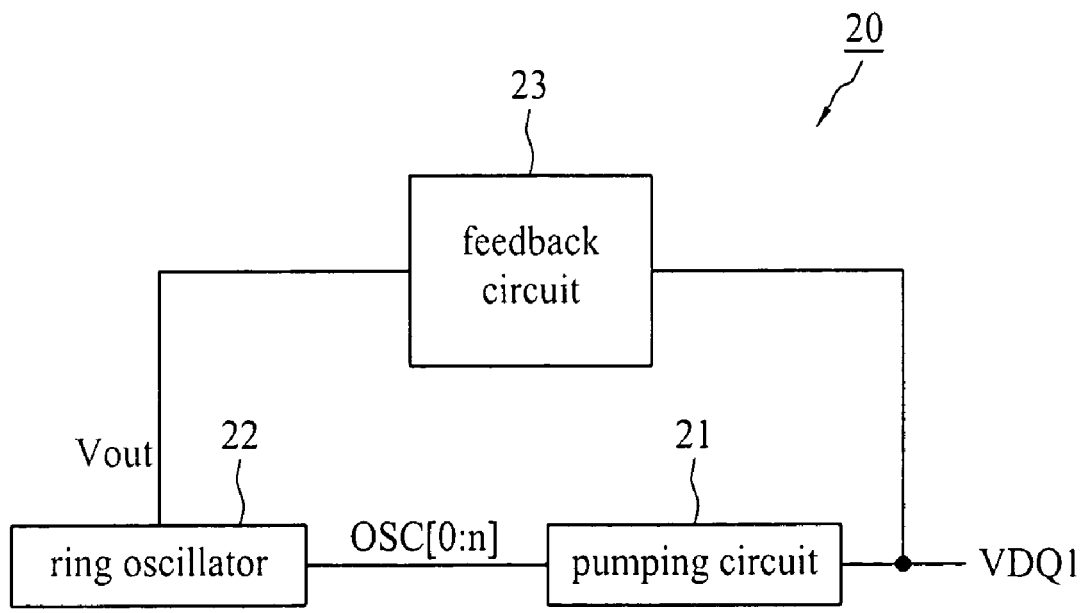
FIG. 2 showers a charge pump in accordance with one embodiment of the present invention.

FIG. 2 shows a charge pump 20 in accordance with the present invention. The charge pump 20 includes a pumping circuit 21, a ring oscillator 22 and a feedback circuit 23. The ring oscillator 22 is powered by a variable voltage Vout, which is generated by the feedback circuit 23 and adversely proportional to VDQ1; that is, the larger VDQ1 is, the smaller the Vout is. Therefore, if VDQ1 is larger than a reference voltage VR, Vout will decrease and force the ring oscillator 22 to slow down its pumping frequency. The output VDQ1 gradually decreases as a result of a longer pumping period, and thus a stable system with little variation is obtained. The ring oscillator 22 generates a plurality of oscillating signals OSC[0:n] to the pumping circuit 21. The oscillating signals OSC[0:n] are different from the prior single oscillating signal OSC with the same intervals between each oscillating signal and its preceding oscillating signal.

Although the preferred embodiment in FIG. 2 includes the feedback circuit 23, ring oscillator 22 and pumping circuit 21, the scope of the present invention further includes the structure having the ring oscillator 22 and the pumping circuit 21 only and the structure having the pumping circuit 21 and feedback circuit 23 only.

Figure 3A:
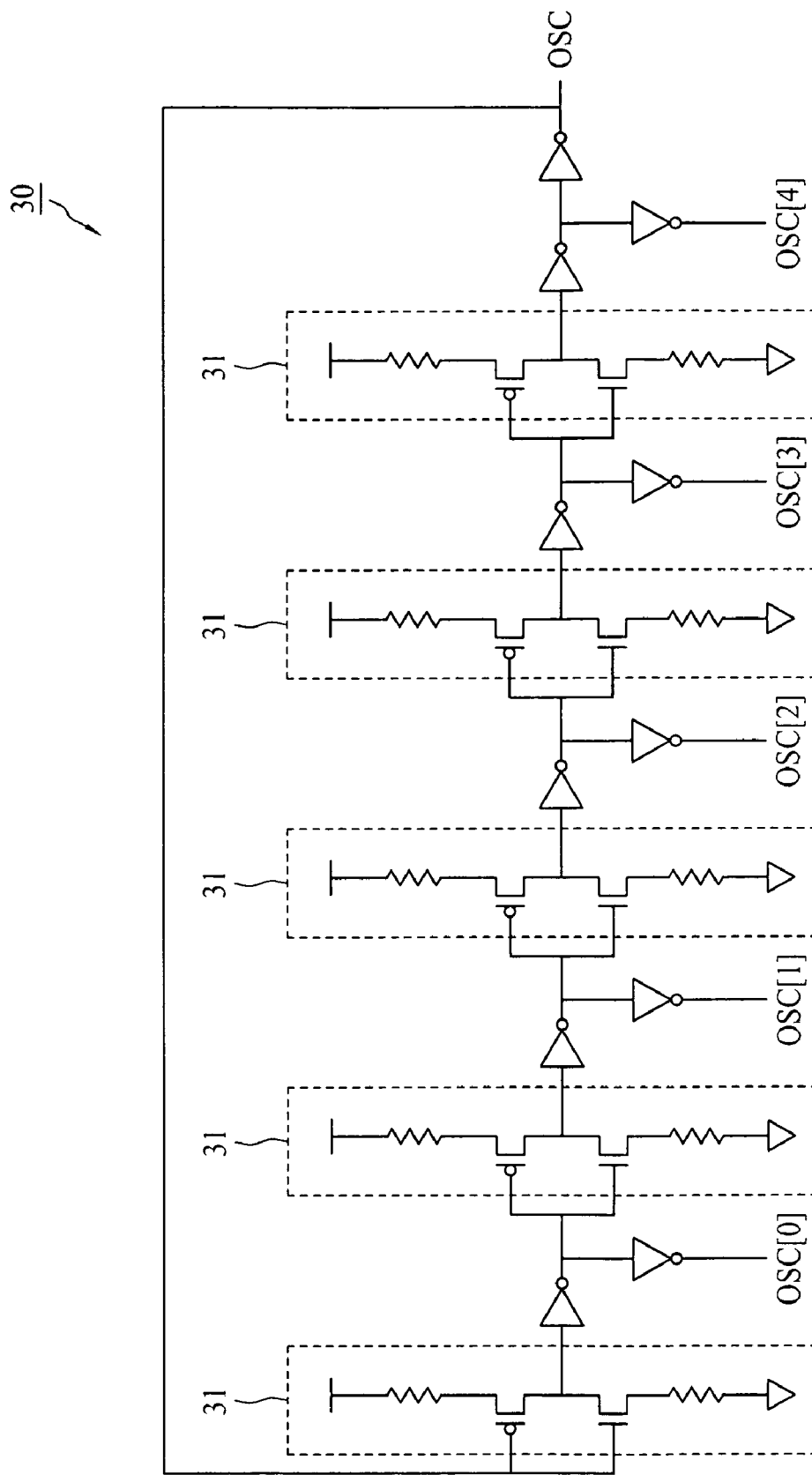
FIGS. 3(a) and 3(b) show ring oscillators in accordance with embodiments of the present invention.
Figure 3B:
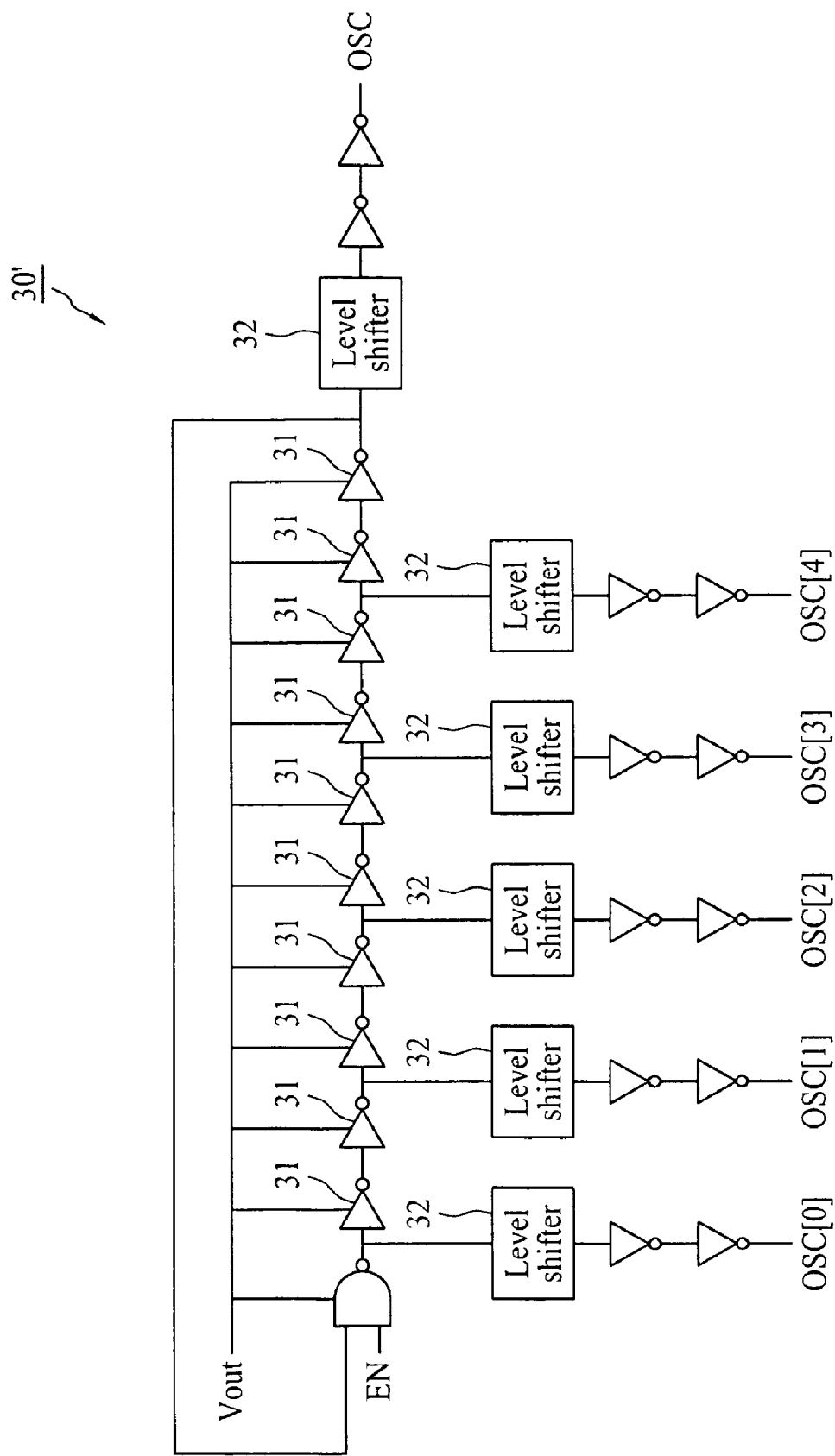
Figure 3C:
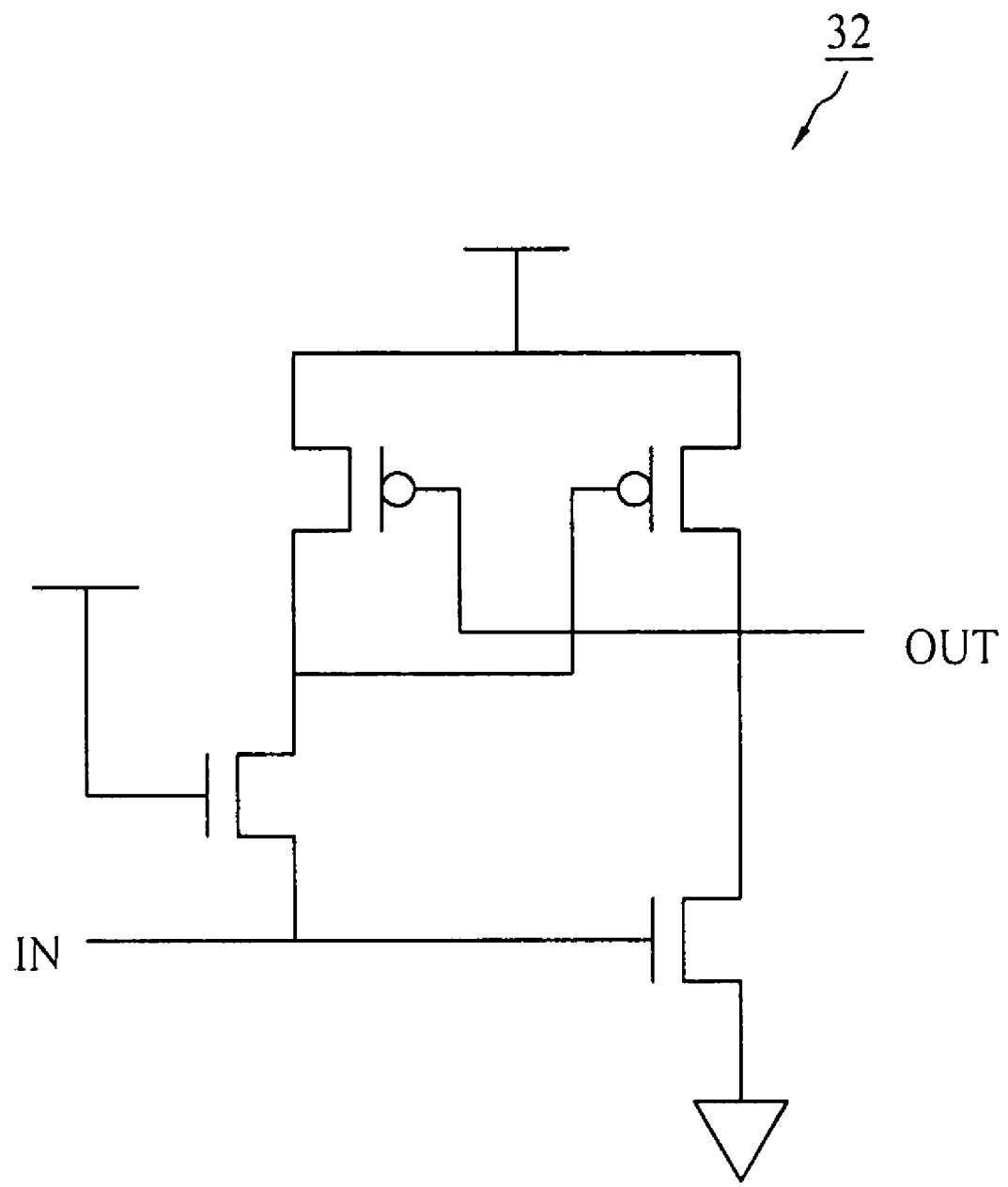
FIG. 3(c) shows an exemplary circuit of the level shifter.

FIG. 3(a) shows a ring oscillator in accordance with one embodiment of the present invention. The ring oscillator 30 includes odd number of the inverters 31 such as five in this example, connected in series. In the output of the five inverters 31, five signals OSC[0] to OSC[4] are extracted, each keeping the same interval from the preceding one. FIG. 3(b) shows a ring oscillator 30' in accordance with another embodiment of the present invention. The signal EN activates the operation of the ring oscillator 30', and the voltage power Vout is variable. As the structure in FIG. 3(a), five signals OSC[0] to OSC[4] are extracted, each keeping the same interval, which is propagation time of two inverters, from its preceding one. In FIG. 3(b), level shifters 32 are added to transform the output of the inverters 31 into general voltage power VCC or ground. FIG. 3(c) shows an exemplary circuit of the level shifter 32.

Figure 1:
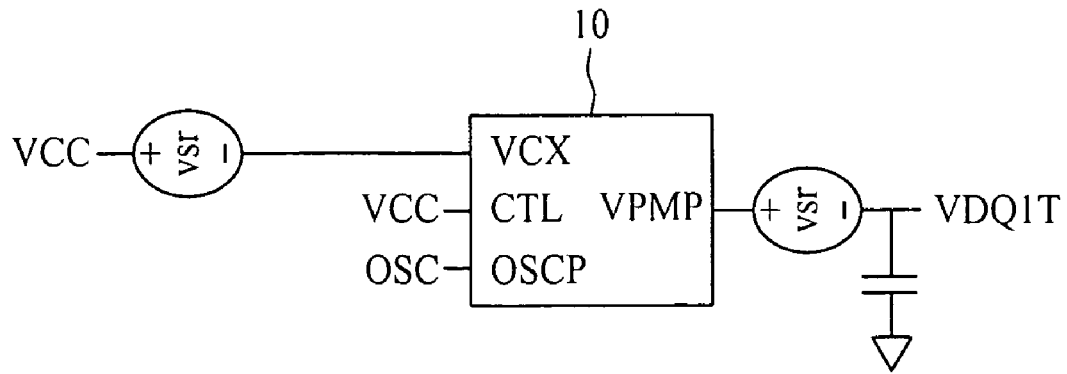
FIG. 1 shows a traditional charge pump.
Figure 4:
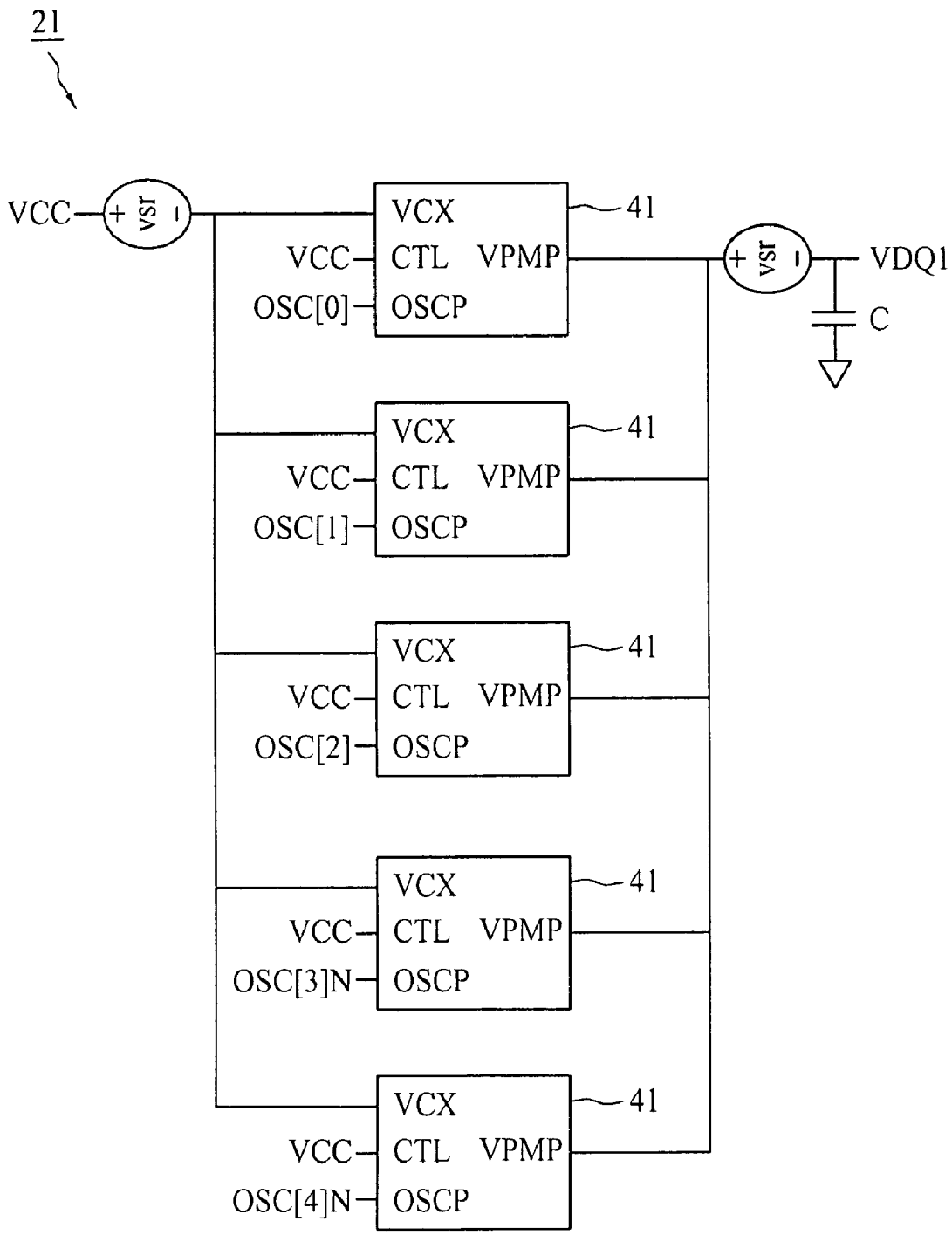
FIG. 4 shows an exemplary pumping circuit.

FIG. 4 shows all exemplary pumping circuit 21. In contrast with the prior charge pump 10 in FIG. 1, the pumping circuit 21 includes five pumping blocks 41 with their clock input connected to one of OSC[0] to OSC[4].

Table 1 illustrates a comparison between the performance of prior art and that of the present invention, wherein VDQ1T represents the output of prior charge pump 10, and VDQ1 represents that of the present charge pump 20. It is assumed that there is a current sink (I sink) and a capacitor located at the output end, which gradually reduce the output voltage after each pumping action. It is apparent that the present invention possesses the advantage of more stable voltage level. For example, under the condition of 3.6V/0° C., the prior art output VDQ1T varies between 6.72V and 8.45V after each pumping action, but the present output VDQ1 varies only between 8.22V and 8.24V after each pumping action; under the condition of 2.7V/90° C. the prior art output VDQ1T varies between 1.06V and 2.16V after each pumping action, but the present output VDQ1 varies only between 1.4V and 1.42V after each pumping action. In short, the structure of the present charge pump 20 shortens intervals ΔT between adjacent pumping actions and thus effectively reduces voltage drop ΔV of the pumping circuit 21.

TABLE 1

| | I sink | number of stages | VDQ1T / VDQ1 | OSC | Capacitor |
|---|---|---|---|---|---|
| 3.6 V/0° C. | 4 mA | 10 | 6.72-8.45 / 8.22-8.24 | 17.3 ns | 20 PF |
| 2.7 V/90° C. | 4 mA | 10 | 1.06-2.16 / 1.4-1.42 | 22.7 ns | 20 PF |
| 3.6 V/0° C. | 2 mA | 10 | 14.5-15.5 / 15.4 | 22.7 ns | 20 PF |
| 2.7 V/90° C. | 2 mA | 10 | 5.33-6.6 / 6.43-6.4 | 22.7 ns | 20 PF |

Figure 5:
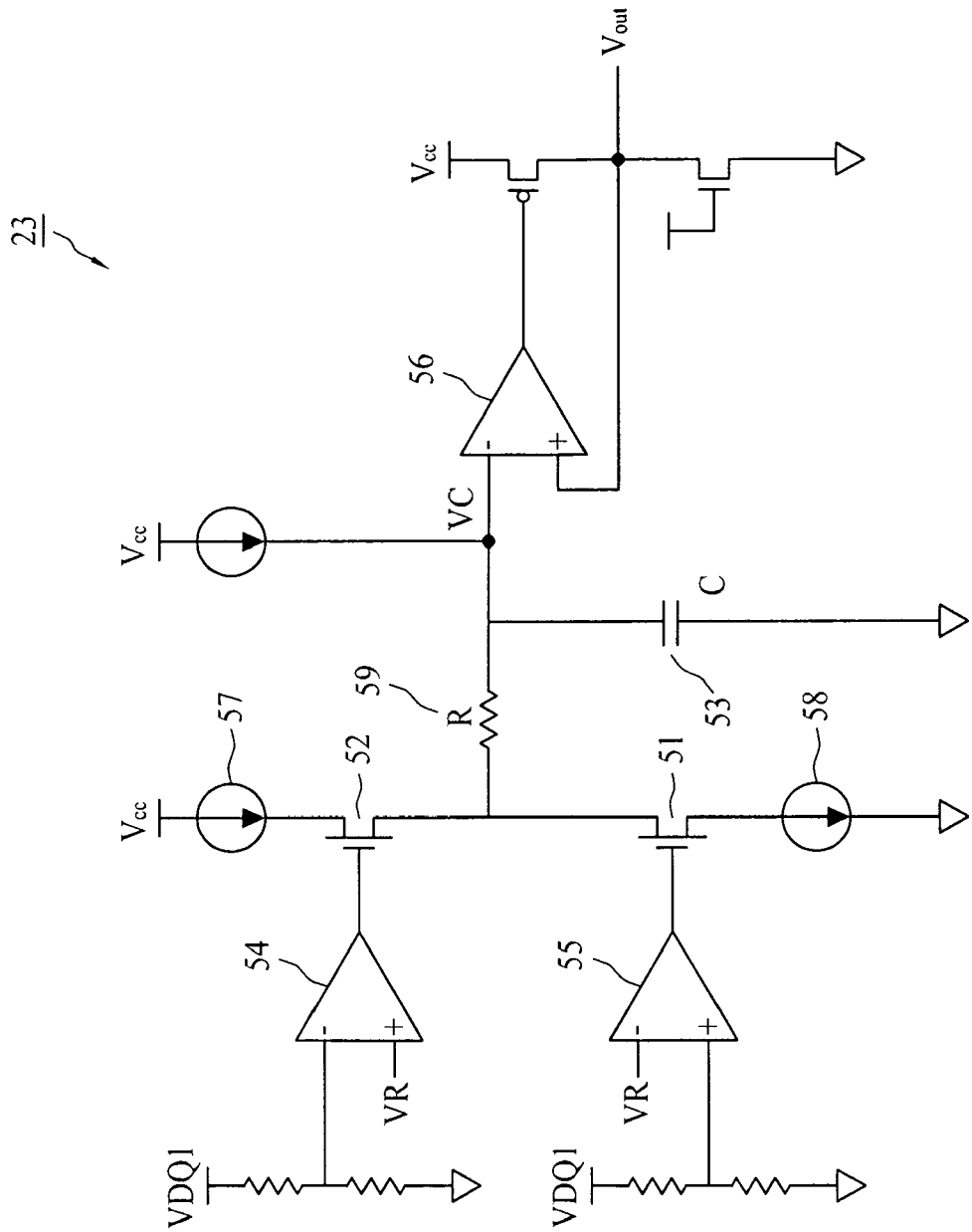
FIG. 5 shows an exemplary feedback circuit.

FIG. 5 shows an exemplary feedback circuit 23. The output Vout of the feedback circuit 23 acting as the power of the ring oscillator 22 shown in FIG. 2 is forced to be equal to the voltage VC through the operating amplifier 56. When VDQ1 is higher than a reference voltage VR, the comparator 55 is activated to turn on the switch 51. At this time because a discharging path is established which goes from the capacitor 53 to the resistor 59, the switch 51 and then the current sink 58, the voltage VC gradually decreases, and so does Vout. On the other hand, when VDQ1 is lower than a reference voltage VR, the comparator 54 is activated to turn on the switch 52. At this time because a charging path is established which goes from the current source 57, to the switch 52, the resistor 59 and then the capacitor 53, the voltage VC gradually increases, and so does Vout. As mentioned above, the voltage Vout is in adverse proportion to VDQ1 through the ring oscillator 22 and the pumping circuit 21; therefore the variation in VDQ1 is kept at the minimum, and power consumption is thus effectively reduced.

Figure 6:
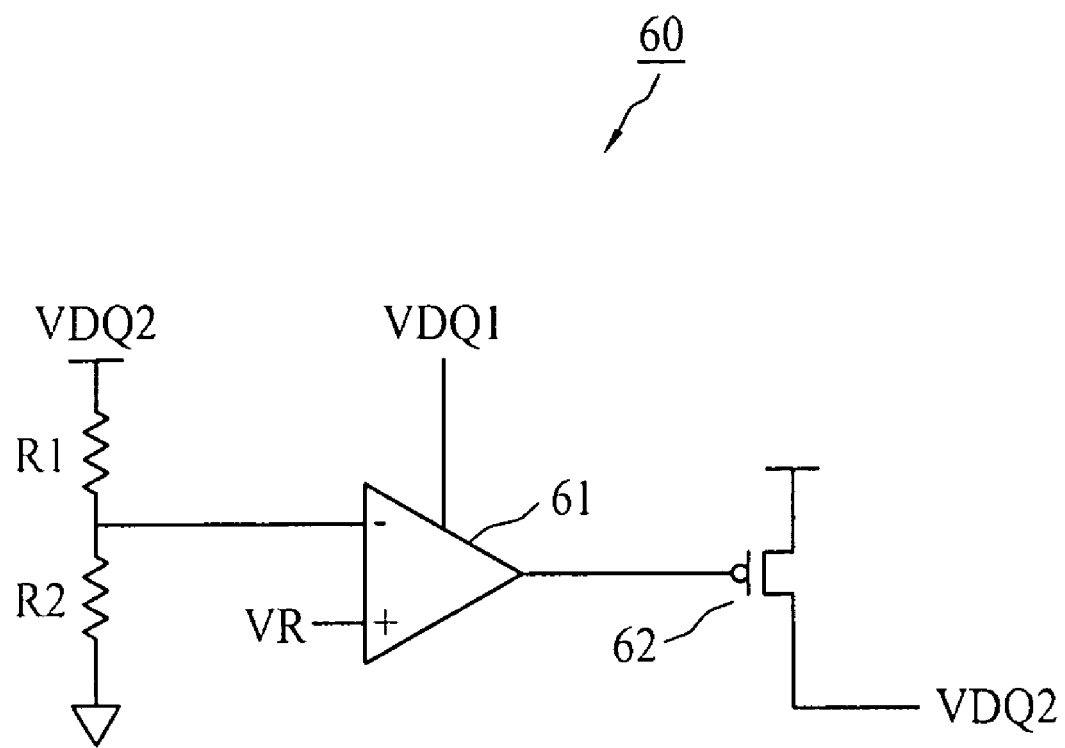
FIG. 6 shows an exemplary regulator.

FIG. 6 shows an exemplary regulator 60, which creates a stable and low variation voltage with magnitude higher than the general power VCC. In many applications, such as ETOX cells in a NOR flash memory, a high voltage used to program through bit lines is demanded. In FIG. 6, VDQ1 acts as the power of the comparator 61, the output of which controls the output VDQ2 of the regulator 60 through a PMOS transistor 62. VDQ2 is expressed as:

$$\frac{(R1 + R2) \times VR}{R2}.$$

Another exemplary performance of the present invention is shown in Table 2. It is apparent that the variation in VDQ2 is even smaller than that in VDQ1, and the higher the voltage source, e.g., 3.6V, the longer the OSC period.

TABLE 2

| | VDQ1 | VDQ2 | I sink | OSC | iVCC |
|---|---|---|---|---|---|
| 2.7 V/90° C. | 4.69-4.84 V | 3.89-3.92 V | 2 mA | 22-29 ns | 29.5 mA |
| 3.6 V/0° C. | 4.4-5.75 V | 3.9-4.06 V | 2 mA | 26-40 ns | 29.5 mA |
| 2.7 V/ 90° C. | 2.36-2.40 V | 2.36-2.40 V | 4 mA | 15.7 ns | 29.5 mA |
| 3.6 V/0° C. | 4.61-4.96 V | 3.84-3.95 V | 4 mA | 22-24 ns | 29.5 mA |

The above-described embodiments of the present invention are intended to be illustrative only. Numerous alternative embodiments may be devised by those skilled in the art without departing from the scope of the following claims.

What is claimed is:

1. A charge pump, comprising:
    a ring oscillator including odd number of inverters connected in series, wherein the outputs of the inverters provide a plurality of oscillating clocks;
    a pumping circuit including a plurality of pumping blocks coupled to each other for outputting a boosted voltage, wherein each pumping block is connected to a corresponding oscillating clock; and
    a feedback circuit for generating the power voltage of the oscillator in response to the boosted voltage, wherein the power voltage of the ring oscillator is adversely proportional to the boosted voltage,
    wherein the feedback circuit includes a charging path and a discharging path, the charging path is activated if the boosted voltage is lower than a reference voltage, and the discharging path is activated if the boosted voltage is higher than a reference voltage;
    wherein the charging path includes a first comparator, a first switch, a capacitor, and a current source, the discharging path includes a second comparator, a second switch, the capacitor and a current sink, the first comparator is coupled to the first switch to further control the charge to the capacitor, and the second comparator is coupled to the second switch to further control the discharge of the capacitor.

2. The charge pump of claim 1, further comprising a plurality of level shifters between the oscillating clocks and the output of the inverters.

3. The charge pump of claim 1, further comprising a regulator for generating a constant voltage which is more invariable than the boosted voltage.

4. The charge pump of claim 3, wherein the regulator includes an operating amplifier and a transistor controlled by the operating amplifier, wherein the boosted voltage acts as the power of the operating amplifier, and the constant voltage acts as the input of the operating amplifier and the output of the transistor.

5. A charge pump, comprising:
    a pumping circuit for outputting a boosted voltage;
    an oscillator including odd number of inverters connected in series, wherein the outputs of the inverters provide a plurality of oscillating clocks to the pumping circuit; and
    a feedback circuit for generating the power voltage of the oscillator in response to the boosted voltage, wherein the power voltage of the ring oscillator is adversely proportional to the boosted voltage,
    wherein the feedback circuit includes a charging path and a discharging path, the charging path is activated if the boosted voltage is lower than a reference voltage, and the discharging path is activated if the boosted voltage is higher than a reference voltage;

wherein the charging path includes a first comparator, a first switch, a capacitor, and a current source, the discharging path includes a second comparator, a second switch, the capacitor and a current sink, the first comparator is coupled to the first switch to further control the charge to the capacitor, and the second comparator is coupled to the second switch to further control the discharge of the capacitor.

6. The charge pump of claim 5, further comprising a regulator for generating a constant voltage which is more invariable than the boosted voltage.

7. The charge pump of claim 6, wherein the regulator includes an operating amplifier and a transistor controlled by the operating amplifier, wherein the boosted voltage acts as the power of the operating amplifier, and the constant voltage acts as the input of the operating amplifier and the output of the transistor.

8. The charge pump of claim 5, wherein the pumping circuit includes a plurality of pumping blocks coupled to each other, each pumping block being connected to a corresponding oscillating clock.

9. The charge pump of claim 8, further comprising a plurality of level shifters between the oscillating clocks and the output of the inverters.

* * * * *